(12) United States Patent
Park

(10) Patent No.: US 9,515,097 B2
(45) Date of Patent: *Dec. 6, 2016

(54) FLEXIBLE DISPLAY DEVICE AND MANUFACTURING METHOD THEREOF

(71) Applicant: LG Display Co., Ltd., Seoul (KR)

(72) Inventor: Chang Bum Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/876,261

(22) Filed: Oct. 6, 2015

(65) Prior Publication Data

US 2016/0027803 A1 Jan. 28, 2016

Related U.S. Application Data

(63) Continuation of application No. 14/496,503, filed on Sep. 25, 2014, now Pat. No. 9,177,973.

(30) Foreign Application Priority Data

Sep. 30, 2013 (KR) .................. 10-2013-0116486

(51) Int. Cl.
H01L 29/04 (2006.01)
H01L 31/036 (2006.01)
H01L 31/0376 (2006.01)
H01L 31/20 (2006.01)
H01L 27/12 (2006.01)
H01L 21/47 (2006.01)
H01L 21/471 (2006.01)
H01L 21/4757 (2006.01)

(52) U.S. Cl.
CPC ............ H01L 27/124 (2013.01); H01L 21/47 (2013.01); H01L 21/471 (2013.01); H01L 21/4757 (2013.01); H01L 27/1218 (2013.01); H01L 27/1225 (2013.01); H01L 27/1259 (2013.01); H01L 27/1262 (2013.01)

(58) Field of Classification Search
CPC ............ H01L 27/1214; H01L 27/3274; H01L 29/4908; H01L 29/0847; H01L 29/41733; H01L 29/42384; H01L 29/7831; H01L 29/786
See application file for complete search history.

(56) References Cited

U.S. PATENT DOCUMENTS 9,177,973 B2 * 11/2015 Park ...................... H01L 27/124
2014/0167038 A1 6/2014 Ahn et al.

* cited by examiner

Primary Examiner — Hoai V Pham
(74) Attorney, Agent, or Firm — Dentons US LLP

(57) ABSTRACT

A flexible display device includes: a flexible substrate having a lower substrate including a prominence pattern, a barrier layer pattern on the prominence pattern, and a planarization film; a gate line on the flexible substrate; a data line crossing the gate line with having a gate insulation film therebetween to define a pixel region; a thin film transistor formed at an intersection of the gate line and the data line; and a passivation layer on the flexible substrate including the thin film transistor. With this configuration, the flexible substrate and the flexible display device can be enhanced by preventing property deterioration of the elements due to bending stresses.

13 Claims, 4 Drawing Sheets

FLEXIBLE DISPLAY DEVICE AND MANUFACTURING METHOD THEREOF

CROSS-REFERENCE TO RELATED APPLICATION

This application is a continuation application of Ser. No. 14/496,503, filed Sep. 25, 2014, which claims priority to Korean Patent Application No. 10-2013-0116486, filed on Sep. 30, 2013, all of which are hereby incorporated by reference for all purposes as if fully set forth herein.

BACKGROUND

Field of the Disclosure

The present application relates to a flexible display device and a manufacturing method thereof. More particularly, the present application relates to a flexible display device which allows elements to be stably formed on a flexible substrate and enhances flexibility of the flexible substrate and reliability, and to a method of manufacturing the same.

Description of the Related Art

Nowadays, the world has seen rapid advances in the electronic display field for visually representing an information. As a result, a variety of flat panel display devices that are slim, light weight, and with low power consumption have been developed. Also, the flat panel display devices have been rapidly replacing the existing cathode ray tubes (CRTs).

As examples of the flat panel display devices, liquid crystal display (LCD) devices, organic light emitting display (OLED) devices, electrophoretic display (electric paper display (EPD)) devices, plasma display panel device (PDPs), field emission display (FED) devices, electroluminescence display devices (ELDs), elector-wetting display (EWD) devices, and so on have been introduced. Such flat panel display devices commonly include a flat display panel, as a necessary component, to display images. The flat display panel is configured with a pair of combined substrates which face each other with having an inherent light emitting or polarizing material layer therebetween.

Also, as the display devices are actively developed, may have enhanced esthetics and provide useful multi-functions to distinguish the products. In general, a related art display device includes a flat panel which uses a glass substrate. Due to this, it is difficult to diversify the design. Moreover, because of large flat areas, the related flat panel devices have a different distance between a main viewing area and its central portion and the main viewing area and its side portion. In other words, the flat panel designs have a different distance between its central portion and its side portion with respect to the main viewing area.

To address this matter, a flexible display device using a flexible material such as a plastic material and so on is developed. The flexible display device can be curved and designed in a variety of shapes, unlike the flat panel display devices of the related art. Such a flexible display device can be more attractive as a next generation display device to replace a monitor of a portable computer, an electronic newspaper, a smart card, and printed media such as books, newspapers, magazines and so on.

To be attractive, the flexible display device must maintain display performance when it is bent. However, the flexible display device can cause display defects when bent or curved. This results from the fact that the flexible display device includes multiple thin film layers and electronic elements which are formed on a flexible substrate. In other words, the thin film layers and the electronic elements can be formed by stacking inorganic materials.

When the flexible display device is severely bent or curved, a bending stress is transferred to the thin film layers and the electronic elements. The bending stress forces the thin film layers to be cracked or deteriorated. Due to this, physical and electrical properties of the electronic elements can deteriorate.

BRIEF SUMMARY

Accordingly, embodiments of the present application are directed to a flexible display device and a manufacturing method thereof that substantially obviate one or more of problems due to the limitations and disadvantages of the related art.

The embodiments are to provide a flexible display device which is adapted to enhance flexibility of a flexible substrate and its flexibility by forming the flexible substrate configured with a lower substrate with a prominence pattern and a planarization film, as well a manufacturing method thereof.

Also, the embodiments are to provide a flexible display device and a manufacturing method thereof which are adapted to prevent property deterioration of elements and stably form the elements by disposing the elements on a prominence pattern of a lower substrate.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment for solving the above-mentioned problems, a flexible display device includes: a flexible substrate having a lower substrate including a prominence pattern, a barrier layer pattern formed on prominence pattern, and a planarization film; a gate line on the flexible substrate; a data line crossing the gate line with having a gate insulation film therebetween to define a pixel region; a thin film transistor at an intersection of the gate line and the data line; and a passivation layer on the flexible substrate covering the thin film transistor.

A manufacturing method of a flexible display device according to another general aspect of the present embodiment includes: forming a barrier layer pattern on a lower substrate; forming a prominence pattern in the lower substrate by etching the lower substrate; forming a planarization film on the lower substrate including the prominence pattern to create a flexible substrate; forming a gate line and a gate electrode on the flexible substrate; forming a gate insulation film on the flexible substrate including the gate line and the gate electrode; forming a thin film transistor by sequentially forming a semiconductor layer overlapping with the gate electrode and a data line and source and drain electrodes on the gate insulation film; and forming a passivation layer on the flexible substrate including the thin film transistor, wherein the gate line and the data line cross each other having the gate insulation film therebetween to define a pixel region.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
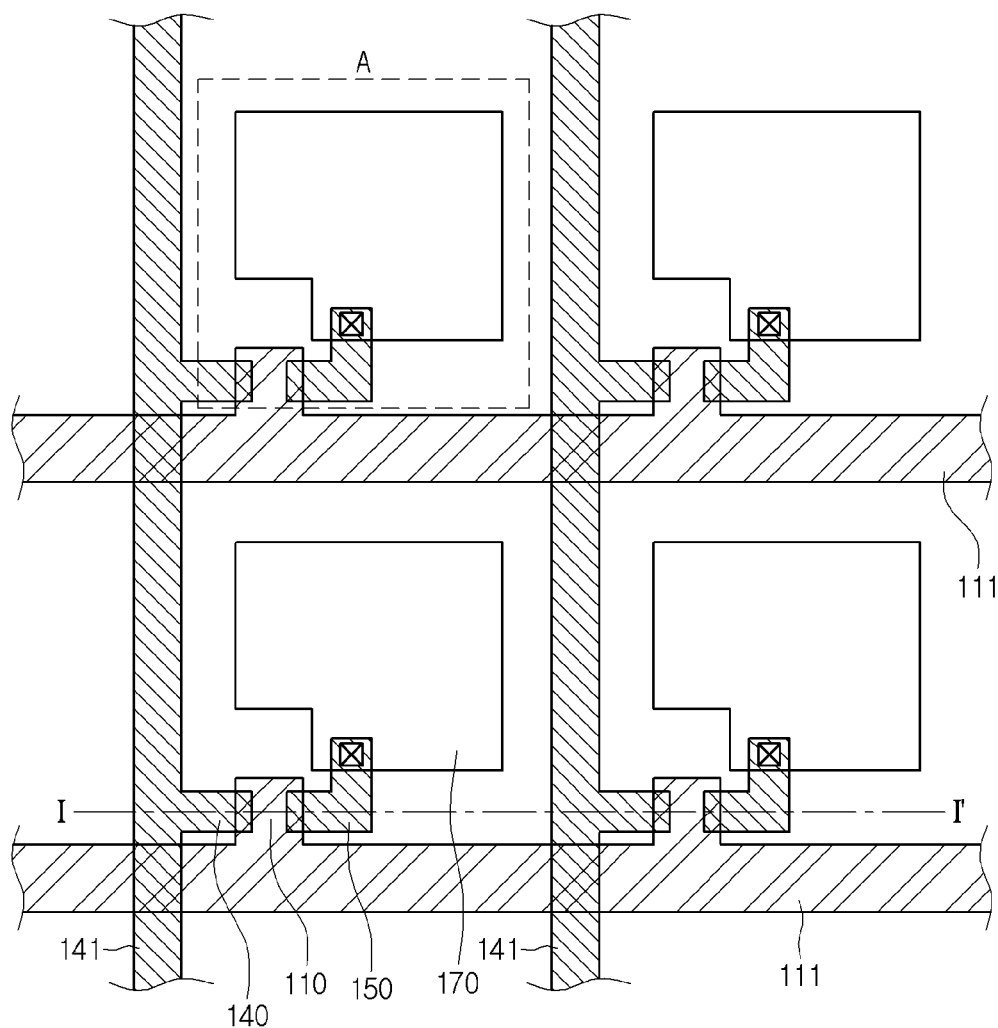
FIG. 1 is a planar view showing a flexible display device according to a first exemplary embodiment of the present disclosure.

Reference will now be made in detail to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a planar view showing a flexible display device according to an embodiment of the present disclosure.

Referring to FIG. 1, a flexible display device according to an embodiment of the present disclosure includes a flexible substrate defined into a display area and a non-display area. Also, the flexible display device includes gate lines 111, which are formed in a direction on the flexible substrate, and data line 141 which are formed to cross the gate lines 111 perpendicularly. The display area of the flexible substrate is defined into a plurality of pixel regions A adjacent to where the gate lines 111 and the data lines 141 cross each other. The flexible display device further includes thin film transistors (TFT) formed at the crossing of the gate lines 111 and the data lines 141. Moreover, the flexible display device includes electrode portions 170 which are connected to the respective thin film transistor via respective contact holes.

If the flexible display device according to an embodiment of the present disclosure is an LCD device, the electrode portion 170 can be a pixel electrode. Alternatively, when the flexible display device according to an embodiment of the present disclosure is an OLED device, the electrode portion 170 can be a first electrode. However, the electrode portion 170 is not limited to these cases. The electrode portion 170 can be modified and applied in a variety of shapes according to display devices to which the flexible display device of the present disclosure is applied.

The thin film transistor includes a gate electrode 110 branched from the gate line 111, and a gate insulation film and a semiconductor layer which are stacked on the flexible substrate provided with the gate electrode 110. Also, the thin film transistor includes a source electrode 140, which is branched from the data line 141 on the semiconductor layer, and a drain electrode 150 which is separated from the source electrode 140 and formed in the same layer as the source electrode 140.

The flexible substrate includes a barrier layer pattern and a prominence pattern which are formed under the thin film transistor. Such a flexible substrate will now be described in detail as follows.

FIGS. 2A through 2D are cross-sectional views illustrating a method of manufacturing a flexible display device according to second embodiment of the present disclosure.

Figure 2A:
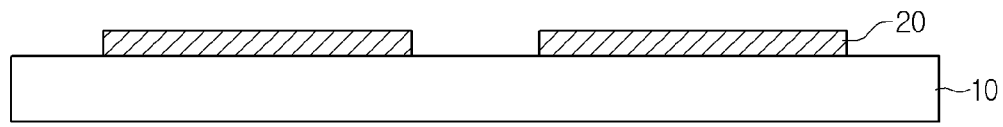
FIGS. 2A through 2D are cross-sectional views illustrating a method of manufacturing a flexible display device according to a second exemplary embodiment of the present disclosure.

Referring to FIG. 2A, a barrier layer pattern 20 may be formed on a lower substrate 10. As an example of the lower substrate 10, a plastic thin film, a metal thin film, or others can be used. However, the lower substrate 10 is not limited to theses. In other words, the lower substrate 10 can be formed from any one of flexible materials different from the above-mentioned materials but suitable for the application.

The barrier layer pattern 20 can be formed from an inorganic material. Actually, the barrier layer pattern 20 can be formed from any one selected from a material group which includes $SiO_2$, $SiN_x$, SiNO, Ge, and mixtures thereof, but it is not limited to these. The barrier layer pattern 20 can be formed from an opaque inorganic material. In this case, the barrier layer pattern 20 can shield light incident to the thin film transistor. Particularly, the barrier layer pattern 20 can block external light incident to a channel domain of the semiconductor layer of the thin film transistor. As such, leakage current of the thin film transistor can be minimized.

Although it is shown in the drawing that the barrier layer pattern 20 is formed in a single layer structure, the barrier layer pattern 20 can be formed in a multi-layered structure with at least two layers. Preferably, the barrier layer pattern 20 can be formed to include one through five layers.

The barrier layer pattern 20 can be formed in a land shape extending along the lower substrate 10. Alternatively, the barrier layer pattern 20 can be formed in an island shape. In this case, the barrier layer pattern 20 can be formed onto the pixel region ("A" in FIG. 1) too. Preferably, the barrier layer pattern 20 is formed only in an element region being occupied by elements, such as the thin film transistor, and so on, which will be formed later.

Figure 2B:
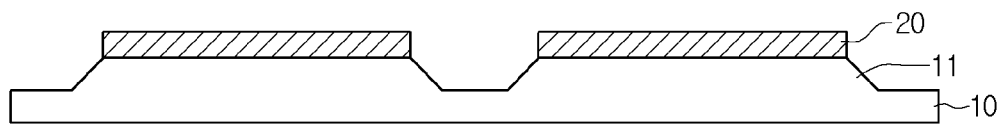

As shown in FIG. 2B, the lower substrate 10 is partially etched using the barrier layer pattern 20 as a mask. Here, the etched lower substrate 10 can be formed to include a prominence pattern 11. The prominence pattern 11 can be formed in the same shape as the barrier layer pattern 20.

In detail, the prominence pattern 11 can be formed in a land shape extending along the lower substrate 10. Alternatively, the prominence pattern 11 can be formed in an island shape. In this case, the prominence pattern 11 can be formed up to the pixel region ("A" in FIG. 1). Preferably, the prominence pattern 11 is formed only in the element region being occupied by elements, such as the thin film transistor, and so on, which will be formed later.

In this manner, the barrier layer pattern 20 and the prominence pattern 11 are formed in the element region. Thus, elements formed above the prominence pattern 11 and the barrier layer pattern 20 can be isolated and stably protected from any physical damage caused by bending stress applied to a flexible substrate.

In other words, the lower substrate 10 is thinner in all regions except the element region. Therefore, flexibility of the lower substrate 10 can be enhanced. In general, it is necessary for the flexible display device to maintain flexibility. Also, flexibility of the flexible display device depends on flexibility of the flexible substrate. To address this matter, the lower substrate 10 is thinner in regions (hereinafter, 'non-element regions) not occupied by electrical elements, and allows a flexible substrate with enhanced flexibility and high reliability against bending stresses.

Figure 2C:
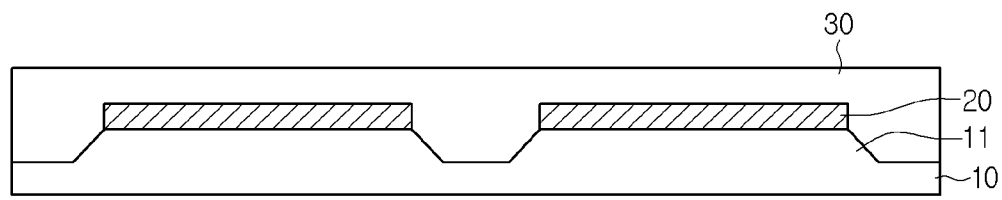

Referring to FIG. 2C, a planarization film 30 can be coated on the lower substrate 10 provided with the prominence pattern 11. The planarization film 30 is used to planarize the lower substrate 10 provided with the prominence pattern 11.

The planarization film 30 can be formed from an organic material. The organic material can be one of cytop, olepin, and so on. However, the planarization film 30 is not limited to these. In other words, the planarization film 30 can be formed from any material with high ductility and suitable for the application.

Figure 2D:
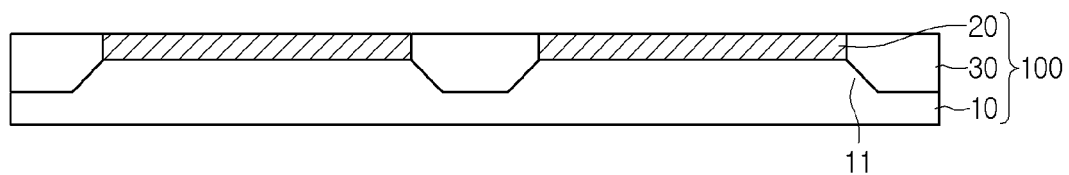

As shown in FIG. 2D, the planarization film 30 is leveled through a leveling process and compensates for height differences resulting from the coating process. A flexible substrate 100 can be prepared through the above-mentioned formation procedure. As such, the flexible substrate 100 includes the lower substrate 10 which is provided with the prominence pattern 11, the barrier layer pattern 20, and the planarization film 30.

The planarization film 30 can be formed to have a thickness corresponding to the thickness of the prominence pattern 11 plus the thickness of the barrier layer pattern 20. As such, the leveling process can be performed on the planarization film 30 until only the upper surface of the barrier layer pattern 20 is exposed.

Subsequently, elements including the thin film transistor, gate and data lines, and so on can be formed on the barrier layer pattern 20 in such a manner as to be in contact with the barrier layer pattern 20. In other words, the elements can be formed above the prominence pattern 11 of the lower substrate 10 and the barrier layer pattern 20. As such, these elements can be more isolated and protected. On the other hand, only the lower substrate 10 and the planarization film 30 exist in the non-element regions being not occupied by the elements. This flexible substrate 100 will now be explained in more detail as follows.

Figure 3A:
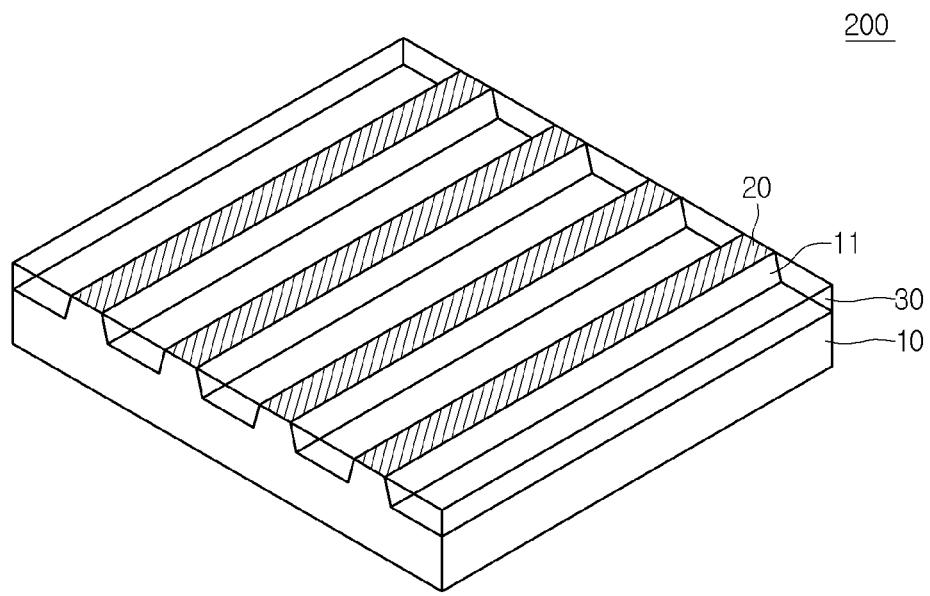
FIGS. 3A and 3B are perspective views showing examples of a flexible substrate in accordance with a third exemplary embodiment of the present disclosure.
Figure 3B:
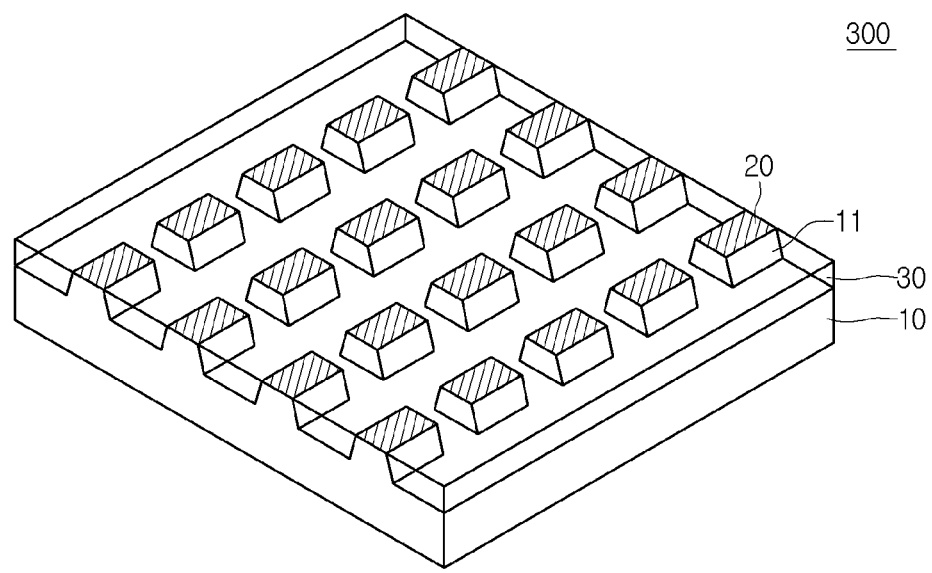

FIGS. 3A and 3B are perspective views showing examples of a flexible substrate in accordance with a third exemplary embodiment of the present disclosure.

FIG. 3A is a perspective view showing a first example of the flexible substrate 200 according to an embodiment of the present disclosure. The flexible substrate 200 of the first example includes a barrier layer pattern 20 and a prominence pattern 11 which are extended along a lower substrate 10.

The barrier layer pattern 20 and the prominence pattern 11 can be formed in the same direction as the data line. Alternatively, the barrier layer pattern 20 and the prominence pattern 11 can be formed in the same direction as the gate line.

FIG. 3B is a perspective view showing a second example of the flexible substrate 300 according to the third embodiment of the present disclosure. The flexible substrate 300 of the second example includes a barrier layer pattern 20 formed in an island shape and a prominence pattern 11 formed in an island shape. The barrier layer pattern 20 and the prominence pattern 11 which have the island shape can be formed in a region corresponding to a pixel region. In other words, the island pattern can be formed in a region corresponding to a pixel region. As such, the barrier layer pattern 20 and prominence patter 11 can be formed into the same number as the pixel regions. The barrier layer pattern 20 and the prominence pattern 11 each having the island shape can be formed only in a part of the pixel region which is occupied by a thin film transistor. Electronic elements will be formed on the flexible substrate 100.

Figure 4:
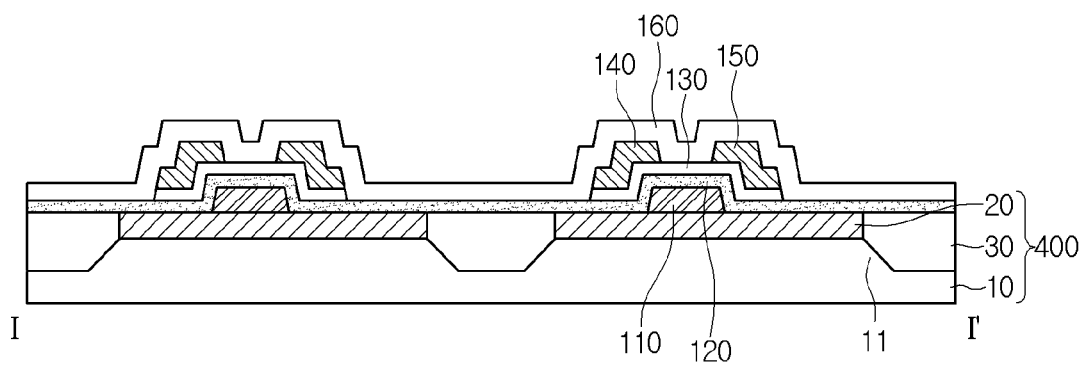
FIG. 4 is a cross-sectional view showing a flexible display device according to the first exemplary embodiment of the present disclosure.

FIG. 4 is a cross-sectional view along I-I' from FIG. 1 showing a flexible display device according to a first embodiment of the present disclosure.

As shown in FIG. 4, a gate electrode 110 branched from the gate line is formed on the flexible substrate 400. Also, a gate insulation film 120 can be formed on the entire surface of the flexible substrate 400 provided with the gate electrode 110.

The gate line and the gate electrode 110 can be formed by stacking at least one metals and transparent conductive materials in at least one layer. The metals include molybdenum Mo, titanium Ti, tantalum Ta, tungsten W, copper Cu, chrome Cr, aluminum Al, and alloys thereof. The transparent conductive materials include ITO (indium-tin-oxide), IZO (indium-zinc-oxide), and ITZO (indium-tin-zinc-oxide). Although the gate electrode 110 is formed in a single metal layer as shown in the drawing, it is not limited to this. In other words, the gate electrode 110 can be formed by stacking at least two metal layers.

The gate insulation film 120 can be formed from one of a dielectric material, a high dielectric constant material, and a mixture thereof. The dielectric material can be one of $SiO_x$, $SiN_x$, SiNO, $HfO_2$, $Al2O_3$, $Y2O_3$, $Ta2O_5$, and so on. Although the gate insulation film 120 is formed in a single layer as shown in the drawing, it is not limited to this. In other words, the gate insulation film 120 can be formed in a multi-layered structure with at least two layers.

A semiconductor layer 130 can be formed on the gate insulation film 120 in such a manner as to overlap with at least a part of the gate electrode 110. Also, a data line, a source electrode 140 branched from the data line, and a drain electrode 150 separated from the source electrode 140 are formed on the flexible substrate 100 provided with the semiconductor layer 130. The source electrode 140 and the drain electrode 150 are partially overlap with the semiconductor layer 130. Then, a passivation layer 160 can be formed on the entire surface of the flexible substrate 400 provided with the source electrode 140 and the drain electrode 150.

A formation procedure of the data line and the source and drain electrodes 140 and 150 can be performed after a formation procedure of the semiconductor layer 130. Alternatively, the semiconductor layer 130, the data line and the source and drain electrodes 140 and 150 can be formed through a single procedure using a half-tone mask or a diffractive mask. In detail, the semiconductor layer 130, the data line and the source and drain electrodes 140 and 150 can be formed by sequentially depositing a semiconductor material layer and a metal layer and patterning the metal layer and the semiconductor material layer using one of the half-tone mask and the diffractive mask.

The method of forming the thin film transistor which includes the gate electrode 110, the semiconductor layer 130 and the source and drain electrodes 140 and 150 is not limited to the above-mentioned formation procedure. Various changes or modifications of the present disclosure are possible without departing from the spirit of the present disclosure as far as the thin film transistor is formed above the prominence pattern 11 of the lower substrate 10 and the barrier layer pattern 20.

The semiconductor layer 130 can be formed from one of a silicon semiconductor and an oxide semiconductor of $A_xB_yC_zO$ (x, y and z≥0). In $A_xB_yC_zO$, "A", "B" and "C" can be selected from Zn, Cd, Ga, In, Sn, Hf, and Zr, respectively. Preferably, the semiconductor layer 130 can be formed from one of ZnO, $InGaZnO_4$, ZnInO, ZnSnO, InZnHfO, SnInO, and SnO, but it is not limited to this.

The data line and the source and drain electrodes 140 and 150 can be formed from one of molybdenum Mo, titanium Ti, tantalum Ta, tungsten W, copper Cu, chrome Cr, aluminum Al, and alloys thereof. Alternatively, the data line and the source and drain electrodes 140 and 150 can be formed from one of ITO (indium-tin-oxide), IZO (indium-zinc-oxide,) and ITZO (indium-tin-zinc-oxide). Although the data line and the source and drain electrodes 140 and 150 are formed in a single metal layer as shown in the drawing, they are not limited to this. In other words, the data line and the source and drain electrodes 140 and 150 can be formed by stacking at least two metal layers.

The thin film transistor including the gate electrode 110, the semiconductor layer 130 and the source and drain electrodes 140 and 150 can be formed above the prominence pattern 11 and the barrier layer 20 of the flexible substrate 400. Also, regions of the lower substrate 10 being occupied by the prominence pattern 11 and the barrier layer pattern 20 have a higher hardness compared to the other regions of the lower substrate 10. As such, elements including the thin film transistor can be stably formed.

Also, only the lower substrate 10 with flexibility and the planarization film 30 exist in the non-element regions not occupied by the elements. As such, flexibility of the flexible substrate 400 can be enhanced. Moreover, the elements can be stably formed and flexibility of the flexible display device can be sufficiently secured.

Figure 5:
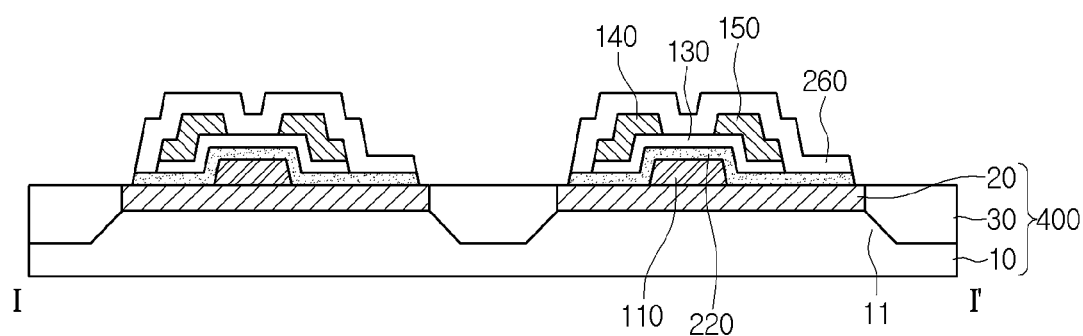
FIG. 5 is a cross-sectional view showing a flexible display device according to another aspect of the first exemplary embodiment of the present disclosure.

FIG. 5 is a cross-sectional view along I-I' of FIG. 1 showing a flexible display device according to another aspect of the first embodiment of the present disclosure.

Referring to FIG. 5, the flexible display device according to this aspect of the first embodiment of the present disclosure includes a thin film transistor, which is configured with a gate electrode 110, a gate insulation film, a semiconductor layer 130, a source electrode 140, a drain electrode 150, and a passivation layer. The description of like elements will be omitted.

After the formation of the passivation layer, a gate insulation pattern 220 and a passivation layer pattern 260 can be formed by removing the passivation layer and the gate insulation film from the remainder of the flexible substrate 400 except the regions of elements, which include the thin film transistor and wirings, through an etching process. Preferably, the gate insulation film pattern 220 and the passivation layer pattern 260 can be formed by etching the passivation layer and the gate insulation film on boundary regions of the pixel regions through the etching process.

In other words, the gate insulation film pattern 220 and the passivation layer pattern 260 can be formed only in the regions being occupied by the elements and the wirings. For example, the gate insulation film pattern 220 and the passivation layer pattern 260 are formed in the regions being occupied by the thin film transistor, the gate line and the data line.

Since the gate insulation film pattern 220 and the passivation layer pattern 260 are formed by partially etching the passivation layer and the gate insulation film, the elements including the thin film transistor and so on can be formed independently of one another. As such, reliability of the flexible display device can be secured. Also, grooves may be formed in the boundaries of the pixel regions. In accordance therewith, flexibility of the flexible display device can be enhanced.

As described above, the flexible display device and the manufacturing method thereof according to embodiments of the present disclosure allow the flexible substrate including the lower substrate with the prominence pattern and the planarization film to be formed. As such, flexibility of the flexible substrate and the flexible display device can be enhanced. Also, the elements can be formed on the prominence pattern of the lower substrate. In accordance therewith, property deterioration of the elements due to bending stresses can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. A flexible display device comprising: a flexible substrate having a lower substrate including a prominence pattern, a barrier layer on the prominence pattern, and a planarization film; a gate line on the flexible substrate; and a data line crossing the gate line to define a pixel region.

2. The flexible display device of claim 1, wherein the prominence pattern is formed in a land shape extending along the lower substrate.

3. The flexible display device of claim 1, wherein the prominence pattern is formed in an island shape.

4. The flexible display device of claim 1, wherein the prominence pattern corresponds to the pixel region.

5. The flexible display device of claim 1, wherein a thin film transistor is formed on the prominence pattern and the barrier layer.

6. The flexible display device of claim 1, wherein the barrier layer is formed from an inorganic material.

7. The flexible display device of claim 1, wherein the planarization film is formed from an organic material.

8. The flexible display device of claim 1, wherein the planarization film is a same thickness as the sum of a thickness of the prominence pattern and a thickness of the barrier layer.

9. The flexible display device of claim 1, further comprising a gate insulation film disposed between the gate line and the data line.

10. The flexible display device of claim 9, further comprising a thin film transistor at an intersection of the gate line and the data line.

11. The flexible display device of claim 10, wherein the gate insulation film is patterned only onto elements including the thin film transistor and wirings including the gate line.

12. The flexible display device of claim 11, further comprising a passivation layer on the flexible substrate and covering the thin film transistor.

13. The flexible display device of claim 12, wherein the passivation layer is patterned only onto elements including the thin film transistor and wirings including the gate line and the data line.

* * * * *